(12) United States Patent
Umemura

(10) Patent No.: US 6,346,749 B1
(45) Date of Patent: Feb. 12, 2002

(54) SEMICONDUCTOR DEVICE

(75) Inventor: Eiichi Umemura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/421,877

(22) Filed: Oct. 21, 1999

(30) Foreign Application Priority Data

Apr. 9, 1999 (JP) ............................................. 11-102602

(51) Int. Cl.$^7$ ............................................. H01L 23/528
(52) U.S. Cl. .................... 257/774; 257/765; 257/767
(58) Field of Search ................ 257/774, 740, 257/765, 767

(56) References Cited

U.S. PATENT DOCUMENTS

| | | |
|---|---|---|
| 5,382,831 A | 1/1995 | Atakov et al. |
| 5,689,139 A | * 11/1997 | Bui et al. .................... 257/758 |
| 5,760,476 A | 6/1998 | Varker et al. |

FOREIGN PATENT DOCUMENTS

| | | | |
|---|---|---|---|
| JP | 10-509286 | 9/1998 | |
| JP | 10340902 A | 12/1998 | |
| JP | 11074268 A | 3/1999 | |
| WO | WO 97/06561 | * 2/1997 | ......... H01L/23/532 |

OTHER PUBLICATIONS

C–K. Hu et al., "Electromigration in two–level interconnect structures with Al alloy lines and W studs," J. Appl. Phys. 72 (1), Jul. 1, 1992, 1992 American Institute of Physics, pp. 291–293.

* cited by examiner

Primary Examiner—Roy Potter
(74) Attorney, Agent, or Firm—Volentine Francos, PLLC

(57) ABSTRACT

A semiconductor device of the present invention comprises a first interconnect and a second interconnect formed from aluminum or aluminum alloy at a different layer to the first interconnect and being connected to the first interconnect via metal not including aluminum, and a hole is provided at the second interconnect. As a result, aluminum loss at ends of the interconnect can be suppressed.

19 Claims, 8 Drawing Sheets

SEMICONDUCTOR DEVICE

BACKGROUND OF THE INVENTION

1. Field of the Invention

The present invention relates to a semiconductor device, and more particularly relates to reliability of an aluminum or aluminum alloy interconnect structure.

2. Description of Related Art

Technology of inlaying refractory metal such as, for example, tungsten in order to form contact holes in semiconductor processing of interconnect structures essential to planarization techniques has been adopted in recent years. A film of, for example, titanium nitride is formed as a refractory metal encapsulation layer after forming via holes in an inter-layer insulation film formed on a lower layer interconnect. A thin film of titanium nitride, which is a refractory metal, is then formed within this via hole. After this, etch-back techniques etc. are employed to ensure that tungsten only remains within the via hole. An aluminum alloy of an upper layer interconnect connected to this tungsten is then formed on the inter-layer insulation film. Electromigration occurring with aluminum alloy and inlaid tungsten is introduced in, for example, the paper "Electromigration in two-level interconnect structures with Al alloy lines and W studs (1992 American Institute of Physics. VOL. 72. NO. 1, July 1992)", etc.

When an aluminum alloy interconnect is connected to a high potential side in a multi-layer interconnect structure employing a layer of inlaid tungsten, electrons migrate from the lower interconnect, through the via holes, to the aluminum alloy interconnect. As a result, the origin of the commencement of migration of the aluminum atoms is concentrated around the via holes, and aluminum at an end of the upper layer interconnect on the high potential side is lose so as to create voids.

SUMMARY OF THE INVENTION

It is therefore the object of the present invention to provide an interconnect structure capable of suppressing loss of aluminum at an end of a high potential-side interconnect.

In order to achieve the aforementioned object, a semiconductor device of the present invention comprises a first interconnect and a second interconnect formed from aluminum or aluminum alloy at a different layer to the first interconnect and being connected to the first interconnect via metal not including aluminum, with a hole being provided at the second interconnect.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

First Embodiment

Figure 1A:
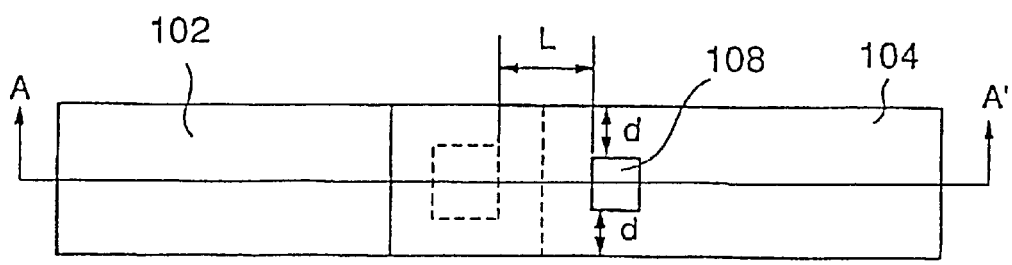
FIGS. 1(a)–1(c) are views showing a first embodiment of the present invention.
Figure 1B:
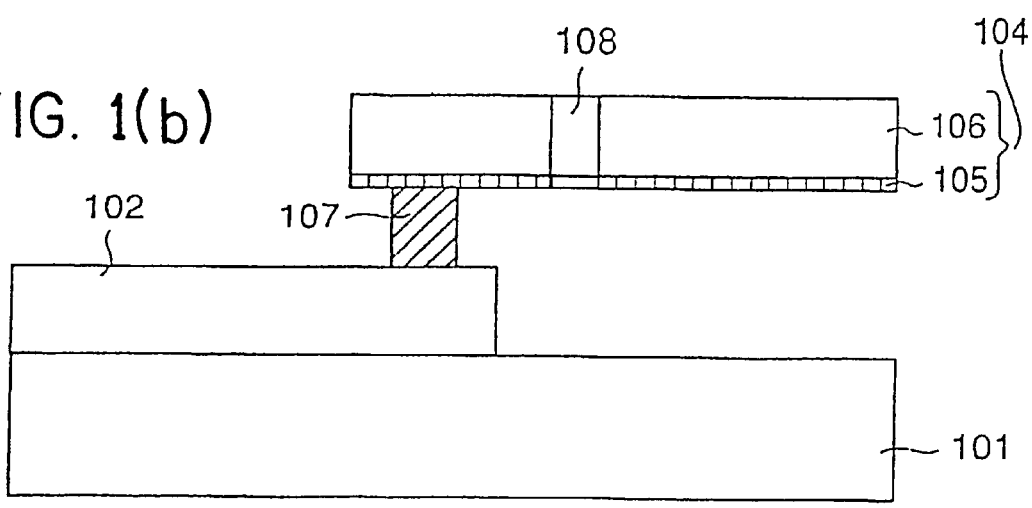

FIG. 1 is an illustration showing the first embodiment of the present invention, where FIG. 1(a) is a plan view, and FIG. 1(b) is a cross-section taken along line A—A' of FIG. 1(a). In FIG. 1, a first interconnect layer 102 is formed on a semiconductor substrate 101. This first interconnect layer 102 employs, for example, aluminum alloy. A second interconnect 104 is then formed on the first interconnect layer 102 via an insulation film (not shown). This second interconnect 104 is formed with a laminated structure from, for example, titanium nitride 105 and aluminum alloy 106. The second interconnect 104 is connected to the first interconnect by an buried layer 107 comprising a refractory metal such as tungsten.

This buried layer 107 can be obtained by forming tungsten on the whole of the entire surface of an insulation film (not shown) provided between the first interconnect layer 102 and the second interconnect 104 and including a hole provided in the insulation film using CVD techniques, and then removing the tungsten from everywhere but the inside of the hole.

The second interconnect layer 104 forms barrier metal of titanium nitride 105, etc. on the insulation film forming the buried layer 107 within the hole. After this, the aluminum alloy 106 is formed on the titanium nitride 105 using sputtering techniques. This aluminum alloy 106 is formed at a typical forming temperature of 100 to 300 degrees centigrade. At this time, the grain size of the aluminum alloy 106 is in the range of 1 $\mu$m to 2 $\mu$m.

The first interconnect layer 102 is then connected to the low potential side, and the second interconnect layer 104 is connected to the high potential side. Atoms therefore migrate from the first interconnect layer 102 to the second interconnect 104 via the buried layer 107 when current flows in the interconnects.

In this embodiment, a hole 108 is formed in the aluminum alloy 106. The width of the second interconnect 104 is divided into portions of widths d by providing this hole 108. These widths d is set to a value of, for example, 1 $\mu$m, which is smaller than the grain size of the aluminum alloy. The hole 108 is provided at a distance of 50 $\mu$m or less from the end of the buried layer 107 and is shown by "L" in the drawings.

Figure 2A:
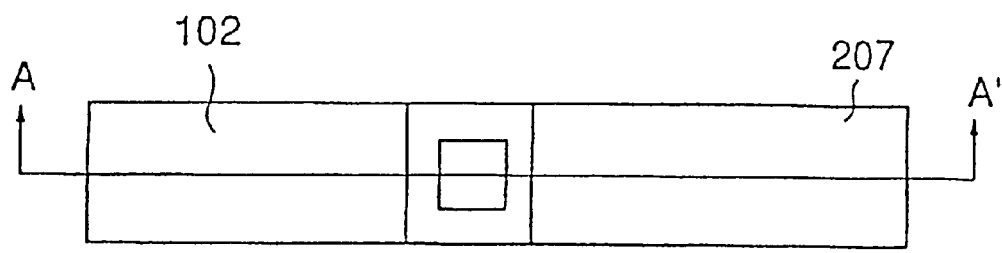
FIGS. 2(a) and 2(b) are views illustrating electromigration of a first embodiment of the present invention.
Figure 2B:
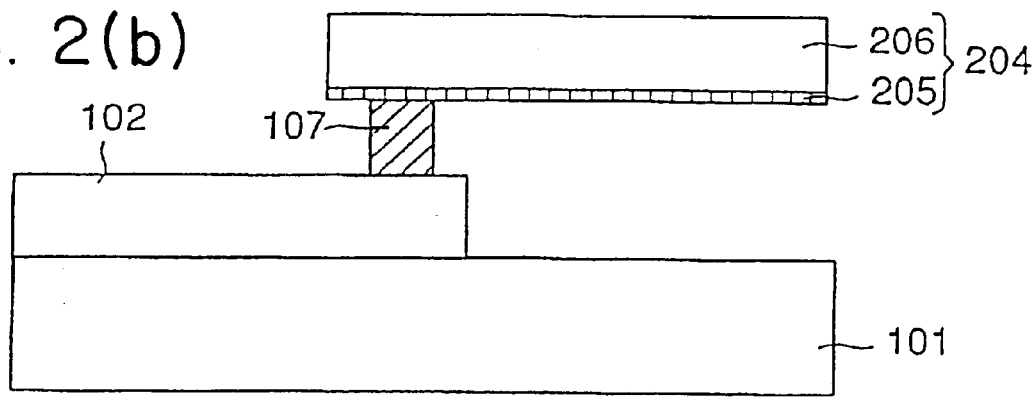
Figure 3A:
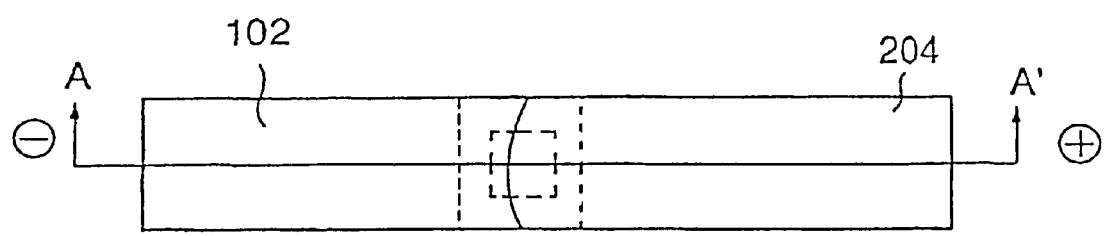
FIGS. 3(a) and 3(b) are views illustrating electromigration of a first embodiment of the present invention.
Figure 3B:
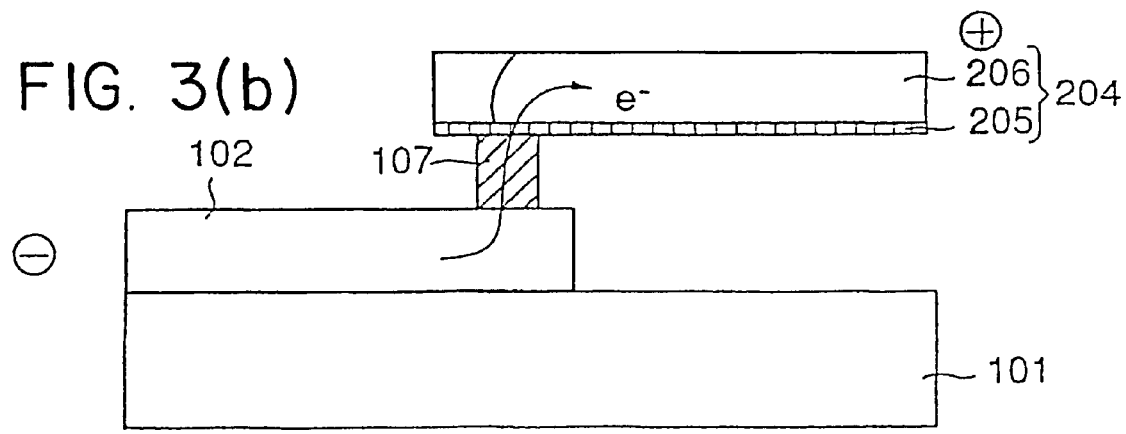

The following is a description using FIG. 2 and FIG. 3 of the reason L is taken to be 50 $\mu$m or less.

Figure 1C:
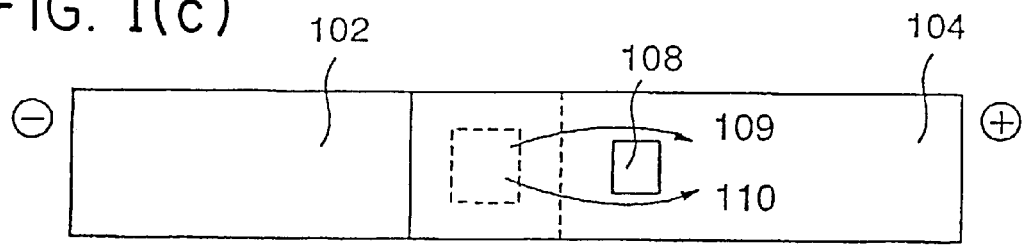

FIG. 2(a) is a plan view and FIG. 2(b) is a cross-section taken along A—A' in FIG. 2(a). The structure in FIG. 2 is the same as the structure in FIG. 1 with the exception of the opening not being formed in a second interconnect layer 204, the same numerals are therefore given to the same parts of the configuration and detailed descriptions thereof are omitted.

FIG. 3 is a view illustrating electron migration and aluminum loss when the first interconnect layer 101 of the structure of FIG. 2 is connected to the low potential side and the second interconnect layer 204 is connected to the high potential side.

When a potential is applied as shown in FIG. 3, electrons flow from the first interconnect layer 102 to the second interconnect layer 204 via the buried layer 107. Aluminum atoms also migrate at this time in accompaniment with the flow of electrons. In the structure shown in FIG. 2 and FIG. 3, the tungsten buried layer 107 and barrier metal of titanium nitride 205 are present between the first interconnect layer and the second interconnect layer. Because of this, there is no source of aluminum regardless of whether aluminum atoms migrate in accompaniment with the movement of electrons and aluminum is therefore lost from the end at an aluminum interconnect 206.

When aluminum alloy is used as the first interconnect layer, the buried layer 107 and titanium nitride barrier metal 205 are not used, and the first interconnect layer 102 and the aluminum alloy layer 206 for the second interconnect layer are directly connected, so aluminum loss does not occur at the second interconnect layer because aluminum atoms are provided from the first interconnect layer.

This kind of migration of aluminum atoms depends on the grain size of the aluminum, i.e. it is well known that it is difficult for aluminum migration to occur if the interconnect width is smaller than the grain size.

When both ends of the aluminum alloy interconnect are connected using, for example, a refractory metal etc. that does not include aluminum, supply and discharge of aluminum atoms cannot take place within the aluminum alloy interconnect. Because of this, an aluminum atom density disparity occurs within the wiring Voids therefore occur at portions where the aluminum atoms are sparse and stress is increased at dense portions. Force (a force opposite to the force due to the electromigration that causes the aluminum atoms to migrate) that sets out to relieve this stress therefore occurs at the dense portions. This is referred to as the backflow effect, and the growth of these voids can be halted when this force and the force causing the aluminum atoms to migrate are in balance. With an aluminum alloy, in order to cause the backflow phenomena to occur and prevent the growth of voids, it is preferable to form a region for blocking migration of aluminum atoms, i.e. a region narrower than the grain size of the aluminum, at a distance of 50 $\mu$m or less from the end of the buried layer 107.

In the first embodiment, as shown in FIG. 1(c), electrons moving to the second interconnect layer 104 move so as to be divided between narrow regions at the sides of the hole 108, as shown by numerals 109 and 110. Migration of the aluminum atoms at these narrow regions can then be blocked by making the narrow regions narrower than the grain size of the aluminum. The occurrence of voids at the second interconnect 104 can therefore be suppressed using the backflow effect by forming a region 50 $\mu$m or less from the end of the buried layer 107.

In this embodiment, it is possible to form the hole 108 at the same time as patterning the second interconnect 104 so that an increase in the number of processes can be prevented.

Figure 4A:
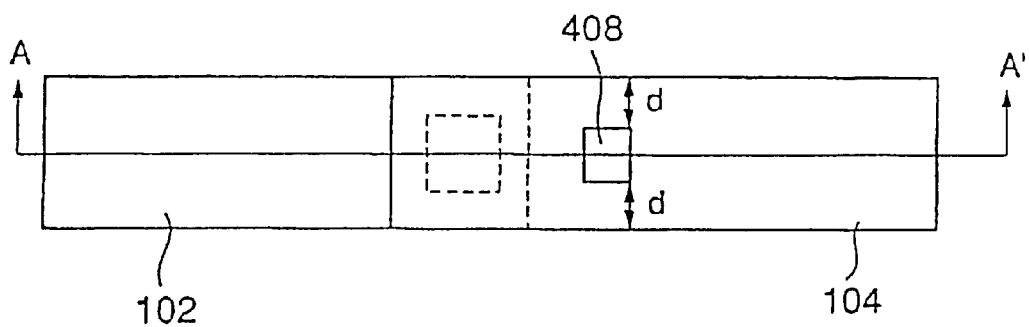
FIGS. 4(a) and 4(b) are views illustrating a modified example of the first embodiment of the present invention.
Figure 4B:
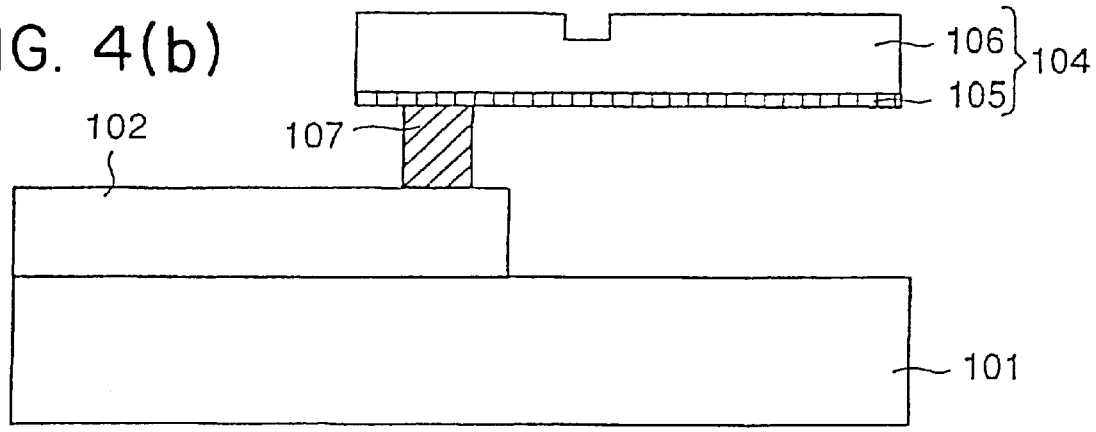

As shown in FIG. 4, the hole 408 can be a groove that does not completely penetrate the second interconnect 104. This groove-shaped hole 408 can be formed by etching a region corresponding to the hole 408 for a second time to a predetermined depth after the second interconnect 104 in the usual manner. In this case, the cross-sectional are can be maintained for the entire interconnect because aluminum alloy remains in the bottom of the aluminum alloy 106 and it is therefore possible to suppress increases in the interconnect resistance.

Second Embodiment

Figure 5A:
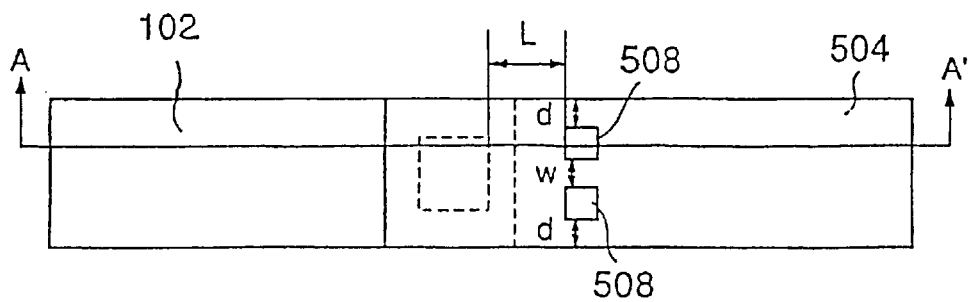
FIGS. 5(a)–5(c) are views illustrating a second embodiment of the present invention.
Figure 5B:
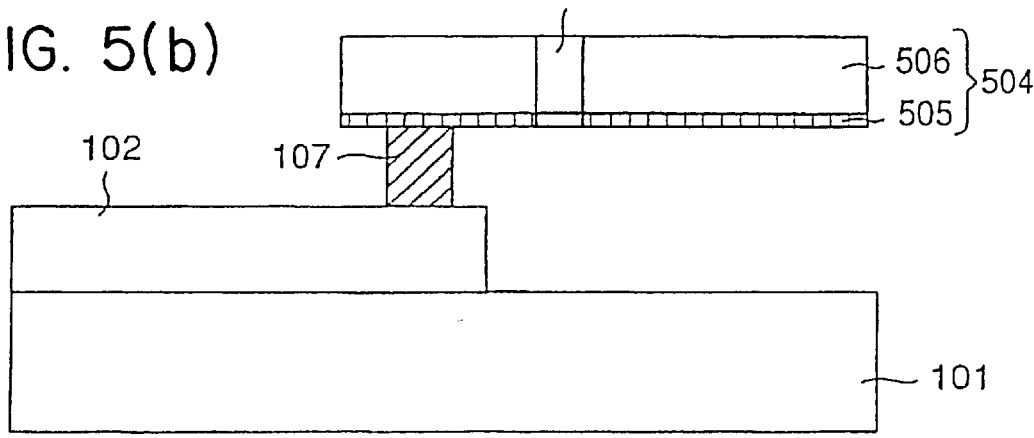

FIG. 5 is a view illustrating a second embodiment of the present invention, where FIG. 5(a) is a plan view and FIG. 5(b) is a cross-section taken along line A—A' of FIG. 5(a). Aspects of the structure in FIG. 5 that are the same as for the first embodiment are given the same numerals and their detailed description is omitted.

The second embodiment differs from the first embodiment in that a plurality of holes 508 are provided across the width of a second interconnect layer 504. This second interconnect layer 504 has a laminated structure comprising a barrier metal layer 505 of titanium nitride etc., and an aluminum alloy 506 laid one on top of another.

The width of the second interconnect layer 504 is substantially divided by the holes into two portions of width d and one portion of width w. It is preferable for the widths d and w of the portions of the interconnect to each be 1 $\mu$m or less at this time. For example, when the width of the interconnect is 5 $\mu$m, the width of the holes 508 are taken to be 1 $\mu$m and the widths d and width w are each taken to be 1 $\mu$m.

Figure 5C:
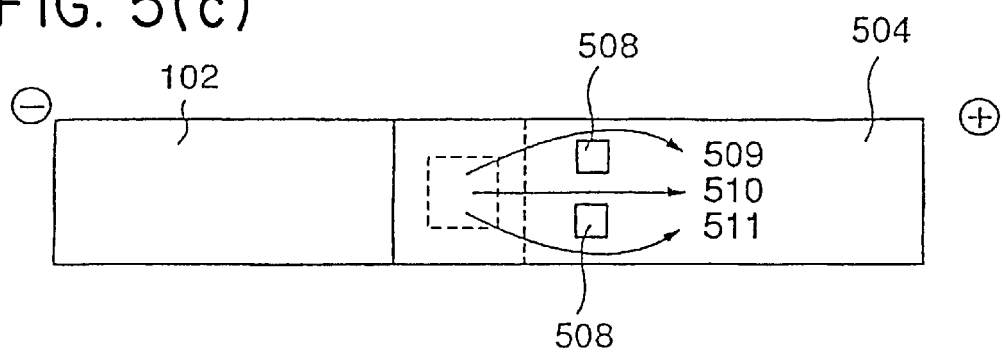

As shown in FIG. 5(c), when the first interconnect layer 102 is connected to the low potential side and the second interconnect layer 504 is connected to the high potential side, the electrons move from the first interconnect layer 102 through the buried layer 107 as shown by the numerals 509, 510 and 511. The electrons therefore move so as to avoid the holes because the holes 508 are provided in the path of movement of the electrons.

The migration of the aluminum molecules can therefore be suppressed by making the respective divided interconnect widths 1 mm, i.e. by making the widths narrower than the grain size of the aluminum.

Further, the aforementioned backflow effect can be obtained by providing the holes 508 at a distance L within 50 $\mu$m from the end of the buried layer and resistance to electromigration can therefore be improved.

In the second embodiment, the width of the aluminum alloy interconnect is made substantially narrower by a plurality of holes and resistance to electromigration can therefore be improved without having to make the holes larger than is necessary.

As in the first embodiment, it is also possible in the second embodiment to form the holes as grooves that do not penetrate the whole of the aluminum alloy of the second interconnect layer.

Third Embodiment

Figure 6A:
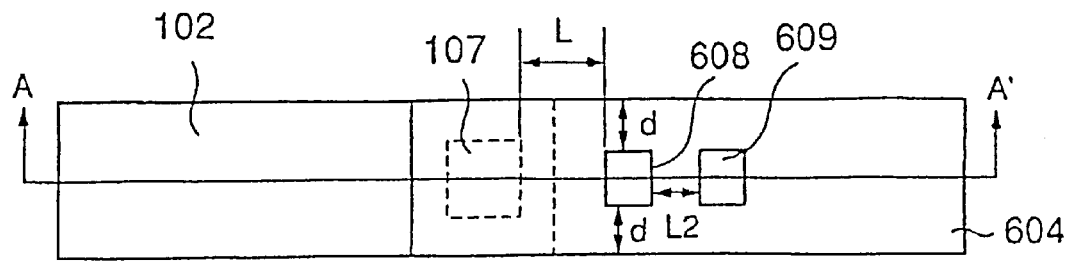
FIGS. 6(a)–6(c) are views illustrating a third embodiment of the present invention.
Figure 6B:
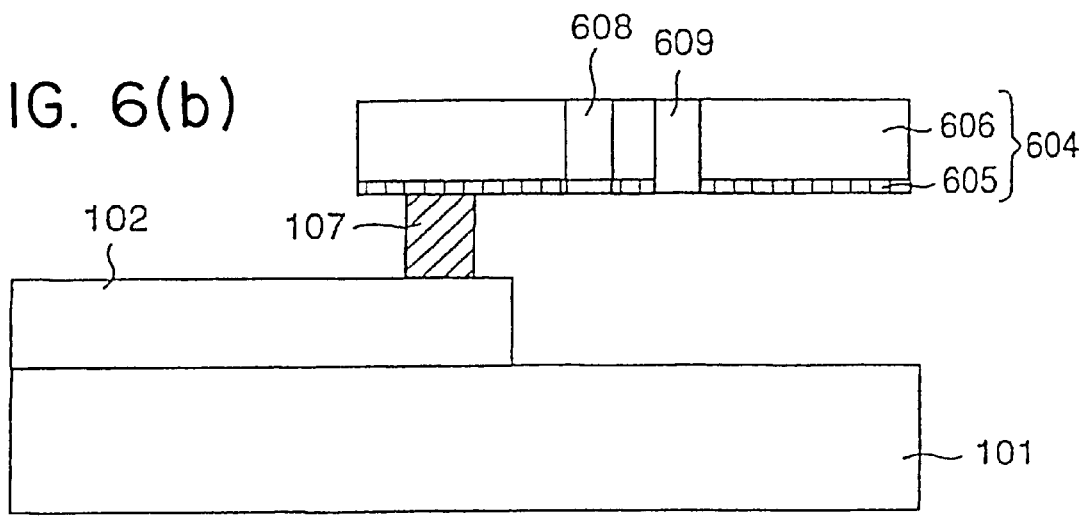

FIG. 6 is an illustration showing a third embodiment of the present invention, where FIG. 6(a) is a plan view and FIG. 6(b) is a cross-section taken along line A—A' of FIG. 6(a). In FIG. 6, aspects of the structure that are the same as for the first embodiment are given the same numerals, and a detailed description thereof is omitted.

The third embodiment differs from the first embodiment in that holes 608 and 609 are arranged in a lengthwise direction along a second interconnect layer 604. It is preferable for a gap L2 between the hole 608 and the hole 609 to be 50 $\mu$m or less, which is the gap required to obtain the aforementioned backflow effect. The second interconnect layer 604 is formed by laminating a barrier metal layer 605 of titanium nitride etc. and an aluminum alloy 606.

Figure 6C:
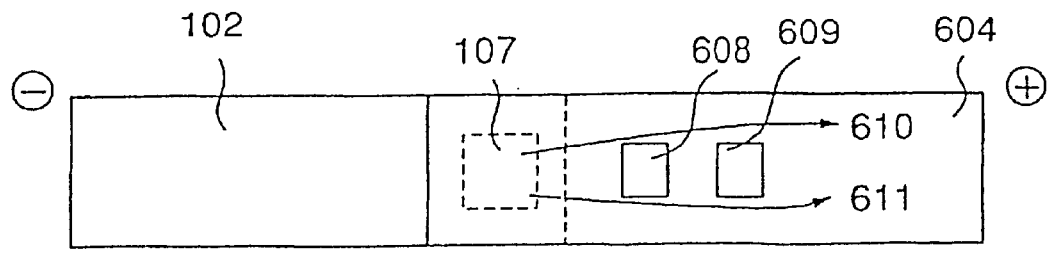

The backflow effect in the third embodiment is described using FIG. 6(c). When the first interconnect layer 102 is connected to the low potential side and the second interconnect layer 604 is connected to the high potential side, electrons migrate from the first interconnect layer 102 to the second interconnect layer 604 via the buried layer 107. At the second interconnect layer 604, the electrons pass through portions that are narrowed by the holes 608 and 609 as shown by numerals 610 and 611, due to the presence of the holes 608 and 609. It is therefore difficult for the aluminum atoms to pass through these narrowed portions because the portions narrowed by the holes 608 and 609 at the second interconnect layer 604 is a width of 1 μm or less. The backflow phenomena therefore occurs between the buried layer 107 and the hole 608, and between the hole 608 and the hole 609. The resistance to electromigration of the entire second interconnect is therefore improved as a result.

In this embodiment, it is also possible to form a plurality of holes across the width of the interconnect as with the structure described in the second embodiment, i.e. it is possible to form a plurality of holes both across the width of the interconnect and lengthwise along the interconnect.

Fourth Embodiment

Figure 7A:
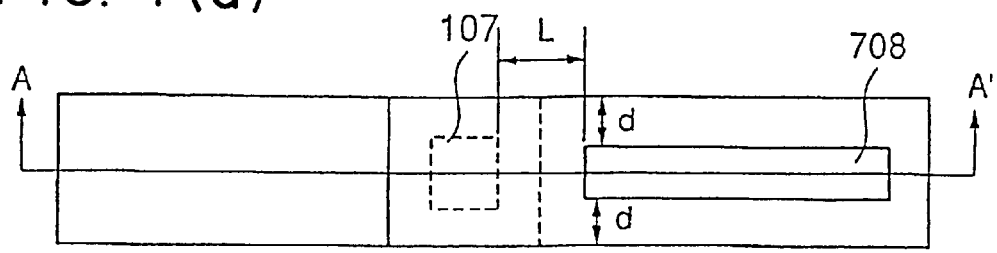
FIGS. 7(a)–7(c) are views illustrating the fourth embodiment of the present invention.
Figure 7B:
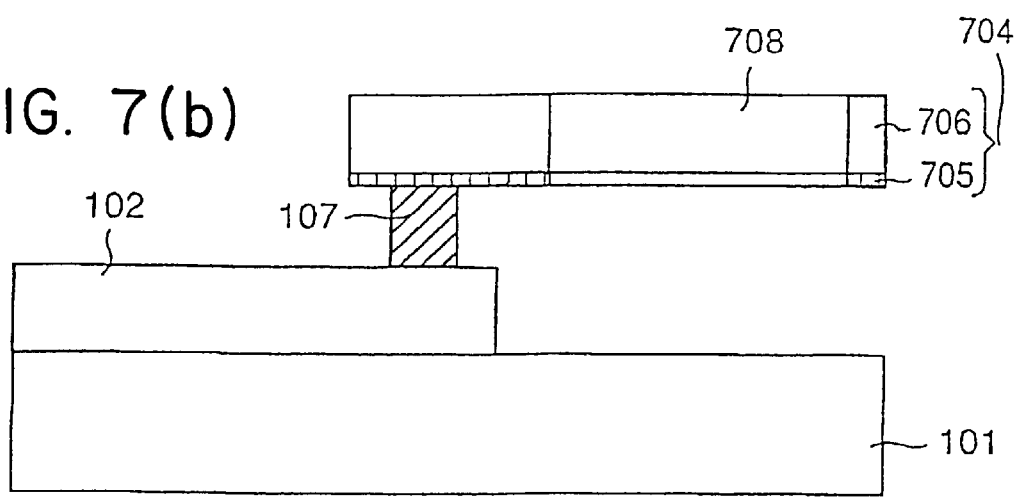

FIG. 7 is an illustration showing a fourth embodiment of the present invention, where FIG. 7(a) is a plan view and FIG. 7(b) is a cross-section taken along line A—A' of FIG. 7(a). In FIG. 7, aspects of the structure that are the same as for the first embodiment are given the same numerals, and a detailed description thereof is omitted.

The fourth embodiment differs from the first embodiment in that a slit-shaped hole 708 is provided lengthwise along a second interconnect layer 704. The second interconnect layer 704 is formed by laminating a barrier metal layer 705 of titanium nitride etc. and an aluminum alloy 706.

In this embodiment is preferable for a gap L between the buried layer 107 and the end of the opening 708 to be 50 μm or less and for the width of the regions divided by the slit-shaped hole 708 in the second interconnect layer 704 to each be 1 μm or less. The length of the hole 708 in a lengthwise direction along the interconnect can be set in an appropriate manner according to the length of the interconnect in which the hole 708 is formed.

Figure 7C:
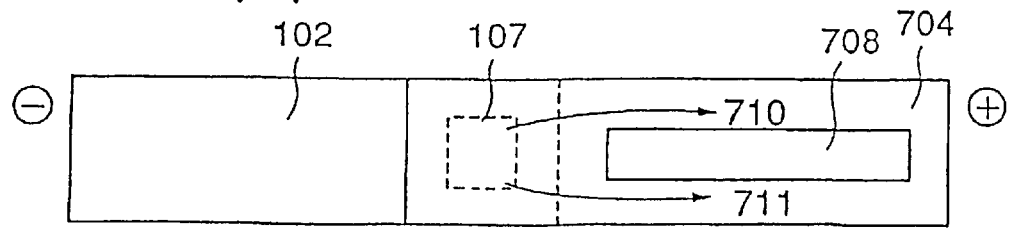

According to this embodiment, as shown in FIG. 7(c), when the first interconnect layer 102 is connected to the low potential side and the second interconnect layer 704 is connected to the high potential side, electrons move from the first interconnect layer 102, through the buried layer 107, as shown by numerals 710 and 711, i.e. the electrons move so as to avoid the hole because the hole 708 is provided in the migration path of the electrons.

It is therefore possible to suppress migration of the aluminum atoms by making the widths into which the interconnect is divided each 1 mm, i.e. narrower than the grain size of the aluminum.

The backflow effect is obtained by providing the hole 708 at a distance L of 50 μm or less from the end of the buried layer and the resistance to electromigration is improved.

Figure 8A:
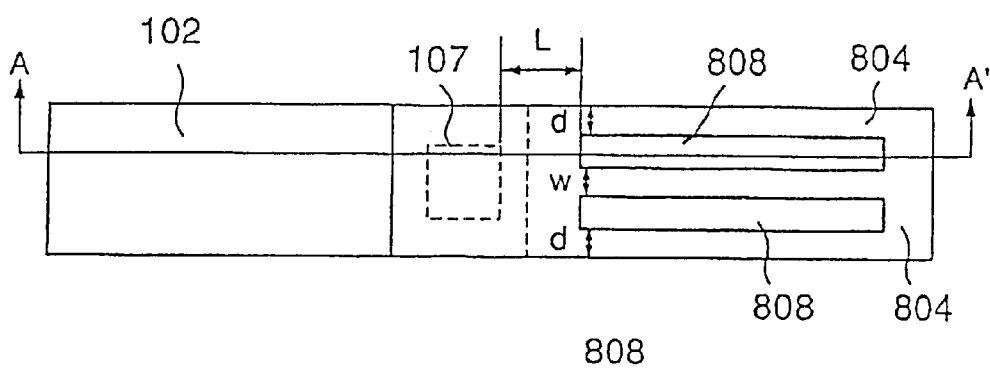
FIGS. 8(a) and 8(b) are views illustrating a further example of the fourth emodiment of the present invention.
Figure 8B:
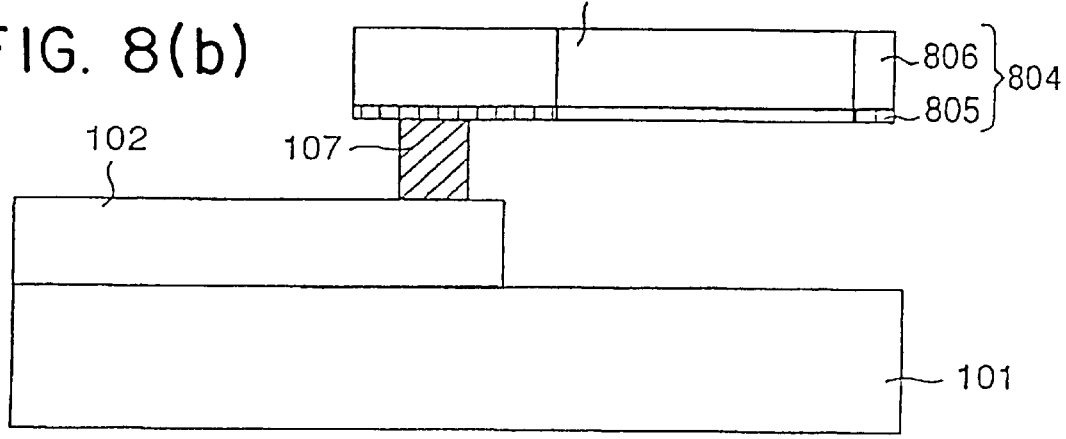

It is also possible to form a plurality of slit-shaped holes 808 as shown in FIG. 8 when the width of the second interconnect layer 804 laminated from a barrier metal layer 805 of titanium nitride etc. and an aluminum alloy 806 is broad. In this case it is preferable to make widths d and w of the region divided by the holes 1 μm or less and to make a distance L from the end of the buried layer 107 to the end of the opening 50 μm or less.

For example, the width of the slit-shaped hole 808 is taken to be 1 μm and the widths d and w are each taken to be 1 μm.

In the fourth embodiment, the hole is formed so as to penetrate the second interconnect layer but this hole can also be formed as a groove that is only removed to approximately midway in the depth direction of the aluminum alloy of the second interconnect.

What is claimed is:

1. A semiconductor device comprising:
   a first conductive line; and
   a second conductive line including aluminum at a different layer than the first conductive line and being connected to the first conductive line via metal that does not include aluminum,
   wherein a hole is provided at said second conductive line, and wherein said second conductive line is divided by the hole into a plurality of regions each of which having a width substantially narrower than grain size of the aluminum.

2. The semiconductor device of claim 1, wherein the metal is a refractory metal.

3. The semiconductor device of claim 1, wherein a distance from an end of the hole to a widthwise direction end of the second conductive line is 1 μm or less.

4. The semiconductor device of claim 1, wherein the first conductive line is connected to a low potential side and the second conductive line is connected to a high potential side.

5. The semiconductor device of claim 1, wherein the hole is provided in a slit-shape running lengthwise along the second conductive line.

6. The semiconductor device of claim 1, wherein a plurality of holes are provided widthwise across the second conductive line to divide the second conductive line into the plurality of regions each having a width substantially narrower than the grain size of aluminum.

7. The semiconductor device of claim 1, wherein the plurality of holes are provided lengthwise along the second conductive line.

8. A semiconductor device comprising:
   a first conductive line; and
   a second conductive line formed from aluminum or aluminum alloy at a different layer than the first conductive line and being connected to the first conductive line via metal not including aluminum,
   wherein a hole is provided at said second conductive line, and wherein a width of said first conductive line ans a width of said second conductive line are substantially the same,
   the second conductive line being divided by the hole into a plurality of regions each of which having a width substantially narrower than grain size of the aluminum or aluminum alloy.

9. The semiconductor device of claim 8, wherein the metal is a refractory metal.

10. The semiconductor device of claim 8, wherein a distance from an end of the hole to a widthwise direction end of the second conductive line is 1 μm or less.

11. The semiconductor device of claim 8, wherein the first conductive line is connected to a low potential side and the second conductive line is connected to a high potential side.

12. The semiconductor device of claim 8, wherein the hole is provided in a slit-shape running lengthwise along the second conductive line.

13. The semiconductor device of claim 8, wherein a plurality of holes are provided widthwise across the second conductive line to divide the second conductive line into the plurality of regions each having a width substantially narrower than the grain size of aluminum.

14. The semiconductor device of claim 8, wherein a plurality of holes are provided lengthwise along the second conductive line.

15. A semiconductor device comprising:

a first conductive line; and a second conductive line formed from aluminum or aluminum alloy at a different layer than the first conductive line and being connected to the first conductive line via metal not including aluminum, wherein a groove is provided at the second conductive line and said groove does not completely penetrate the second conductive line.

16. The semiconductor device according to claim 15, wherein said second conductive line is divided by the groove into a plurality of regions each of which having a width substantially narrower than grain size of the aluminum or aluminum alloy.

17. The semiconductor device of claim 16, wherein a distance from an edge of the groove to a widthwise direction end of the second conductive line is 1 μm or less.

18. The semiconductor device of claim 15, wherein the metal is a refractory metal.

19. The semiconductor device of claim 15, wherein the first conductive line is connected to a low potential side and the second conductive line is connected to a high potential side.

* * * * *